United States Patent
Dainese et al.

(10) Patent No.: US 12,527,075 B2
(45) Date of Patent: Jan. 13, 2026

(54) INSULATED GATE BIPOLAR TRANSISTOR

(71) Applicant: Infineon Technologies Austria AG, Villach (AT)

(72) Inventors: Matteo Dainese, Munich (DE); Alim Karmous, Dresden (DE); Christian Philipp Sandow, Haar (DE); Francisco Javier Santos Rodriguez, Villach (AT); Daniel Schlögl, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 398 days.

(21) Appl. No.: 18/116,565

(22) Filed: Mar. 2, 2023

(65) Prior Publication Data

US 2023/0290828 A1  Sep. 14, 2023

(30) Foreign Application Priority Data

Mar. 9, 2022 (DE) .......................... 102022105532.9

(51) Int. Cl.
*H10D 84/80* (2025.01)
*H10D 12/00* (2025.01)
(Continued)

(52) U.S. Cl.
CPC ......... *H10D 84/811* (2025.01); *H10D 12/038* (2025.01); *H10D 12/481* (2025.01);
(Continued)

(58) Field of Classification Search
CPC ....... H10D 12/411–491; H10D 62/117; H10D 84/811
See application file for complete search history.

(56) References Cited

U.S. PATENT DOCUMENTS

| 2011/0186965 | A1 | 8/2011 | Nemoto et al. |
| 2019/0157436 | A1* | 5/2019 | Lau ........................ H10D 12/00 |
| 2019/0245070 | A1 | 8/2019 | Yilmaz |

FOREIGN PATENT DOCUMENTS

CN  205248280 U  5/2016

OTHER PUBLICATIONS

Brockmeier, A., et al., "Surface tension and its role for vertical wet etching of silicon", IOP Publishing, Journal of Micromechanics and Microengineering; J. Micromech. Microeng. 22; 2012, pp. 1-7.

(Continued)

*Primary Examiner* — Daniel P Shook
(74) *Attorney, Agent, or Firm* — Murphy, Bilak & Homiller, PLLC

(57) ABSTRACT

An insulated gate bipolar transistor (IGBT) is proposed. The IGBT includes a semiconductor body having a first surface and a second surface. The IGBT further includes an active area and an edge termination area that at least partly surrounds the active area. The active area includes a first part of an active IGBT area and a second part of the active IGBT area. The IGBT further includes a contact on the second surface of the semiconductor body. A minimum vertical distance between the contact in the first part of the active IGBT area and a reference level at the first surface is larger than a minimum vertical distance between the contact in the second part of the active IGBT area and the reference level at the first surface.

22 Claims, 6 Drawing Sheets

(51) Int. Cl.
*H10D 12/01* (2025.01)
*H10D 62/10* (2025.01)

(52) U.S. Cl.
CPC ......... *H10D 62/104* (2025.01); *H10D 62/106* (2025.01); *H10D 62/117* (2025.01)

(56) References Cited

OTHER PUBLICATIONS

Merlos, A., et al., "TMAH/IPA anisotropic etching characteristics", Sensors and Actuators A, 37-38, 1993, pp. 737-743.

Okawa, et al., "Chemical mechanical polishing of titanium with colloidal silica containing hydrogen peroxide—mirror polishing and surface properties", Dental Materials Journal 2009; 28(1), 2009, pp. 68-74.

\* cited by examiner

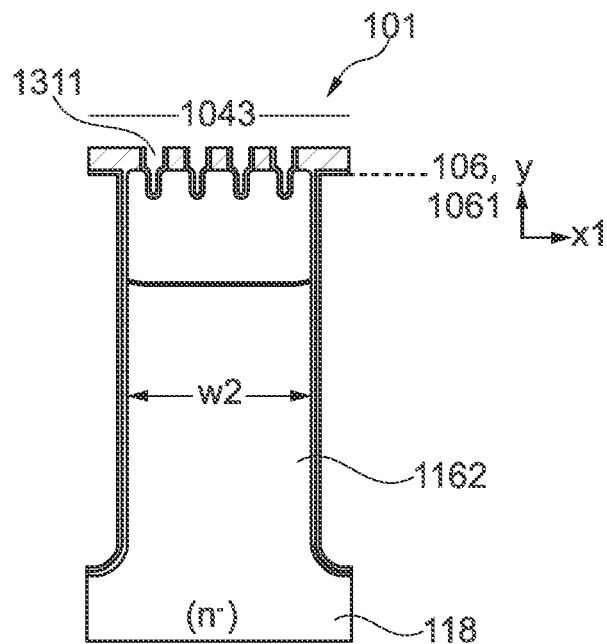
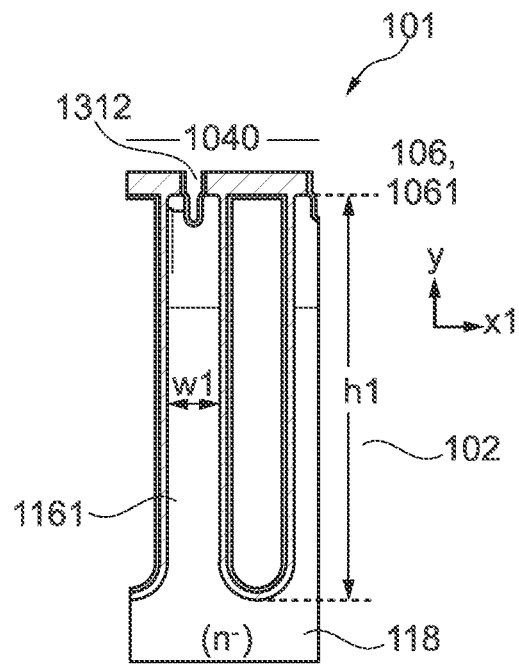
Fig. 11A      Fig. 11B
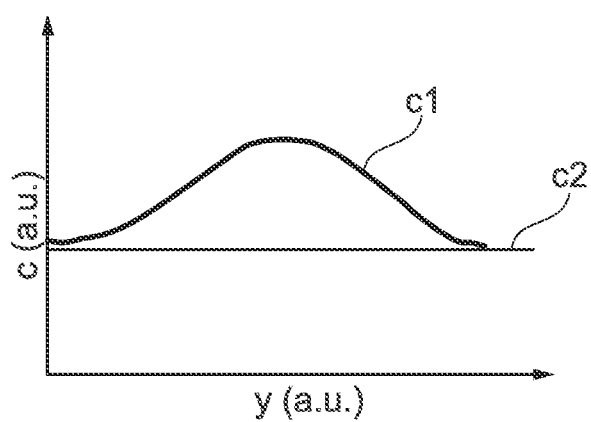
Fig. 12

INSULATED GATE BIPOLAR TRANSISTOR

TECHNICAL FIELD

The present disclosure is related to a semiconductor device, in particular to an insulated gate bipolar transistor, IGBT, comprising an active area and an edge termination area that at least partly surrounds the active area.

BACKGROUND

Technology development of new generations of semiconductor devices, e.g. IGBTs, aims at improving electric device characteristics and reducing costs by shrinking device geometries. Although costs may be reduced by shrinking device geometries, a variety of tradeoffs and challenges have to be met when increasing device functionalities per unit area. For example, a trade-off between area-specific on-state resistance, $R_{on} \times A$ and switching efficiency requires design optimization.

Thus, there is a need for an improved IGBT.

SUMMARY

An example of the present disclosure relates to an insulated gate bipolar transistor, IGBT. The IGBT comprises a semiconductor body having a first surface and a second surface The IGBT further comprises an active area and an edge termination area that at least partly surrounds the active area. The active area comprises a first part of an active IGBT area and a second part of the active IGBT area. The IGBT further comprises a contact on the second surface of the semiconductor body. A minimum vertical distance between the contact in the first part of the active IGBT area and a reference level at the first surface is larger than a minimum vertical distance between the contact in the second part of the active IGBT area and the reference level at the first surface.

Another example of the present disclosure relates to a method for manufacturing an insulated gate bipolar transistor, IGBT. The method comprises forming, in a semiconductor body having a first surface and a second surface, an active area and an edge termination area that at least partly surrounds the active area. The active area comprises a first part of an active IGBT area and a second part of the active IGBT area. The method further comprises forming a contact on the second surface of the semiconductor body. A minimum vertical distance between the contact in the first part of the active IGBT area and a reference level at the first surface is larger than a minimum vertical distance between the contact in the second part of the active IGBT area and the reference level at the first surface.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

FIGS. 11A and 11B are partial cross-sectional views for illustrating design examples of transistor and diode cells at a front side of a RC IGBT.

FIG. 12 is a schematic graph for illustrating vertical doping concentration profiles in mesa regions of an active diode area and active IGBT area of a RC IGBT.

DETAILED DESCRIPTION

Figure 1A:
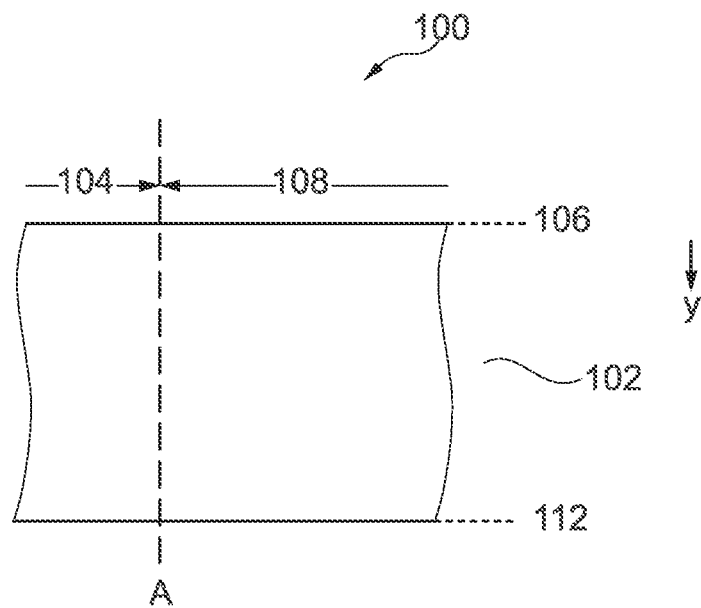
FIGS. 1A and 1B are partial cross-sectional views for illustrating an example of an IGBT having different substrate thicknesses in an active area of the IGBT.

In the following detailed description, reference is made to the accompanying drawings, which form a part hereof and in which are shown by way of illustrations specific examples of IGBTs. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of an insulated gate bipolar transistor, IGBT, may include a semiconductor body having a first surface and a second surface. The IGBT may include an active area and an edge termination area that at least partly surrounds the active area. The active area may include a first part of an active IGBT area and a second part of the active IGBT area. The IGBT may further include a contact on the second surface of the semiconductor body. A minimum vertical distance between the contact in the first part of the active IGBT area and a reference level at the first surface may be larger than a minimum vertical distance between the contact in the second part of the active IGBT area and the reference level at the first surface.

The IGBT may be part of an integrated circuit, or may be a discrete semiconductor device or a semiconductor module, for example. The IGBT may be or a power IGBT, e.g. a vertical power IGBT having a load current flow between the first surface and the second surface opposite to the first surface. The power IGBT may be configured to conduct currents of more than 1 A or more than 10 A or more than 30 A or more than 50 A or more than 75 A or even more than 100 A, and may be further configured to block voltages between load electrodes, e.g. between emitter and collector, in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example. For realizing a desired current carrying capacity, the IGBT may be designed by a plurality of parallel-connected IGBT cells. The parallel-connected IGBT cells may, for example, be IGBT cells formed in the shape of a strip or a strip segment. Of course, the IGBT cells can also have any other shape, e.g., circular, elliptical, polygonal such as octahedral.

The semiconductor body may include or consist of a semiconductor substrate. A material of the semiconductor body may be from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The first surface may be a front surface or a top surface of the semiconductor body, and the second surface may be a back surface or a rear surface of the semiconductor body, for ex-ample. The semiconductor body may be attached to a lead frame via the second surface, for example. Over the first surface of the semiconductor body, bond pads may be arranged and bond wires may be bonded on the bond pads, for example. The reference level at the first surface may coincide with a planar portion of the first surface of the semiconductor body, e.g. a planar interface portion between the semiconductor body and an interlayer dielectric directly adjoining the semiconductor body from above.

The edge termination area may include a termination structure. In a blocking mode or in a reverse biased mode of the IGBT, the blocking voltage between the active area and a field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof, for example.

The active area may be an area where an emitter region of the IGBT at the first surface and a collector region of the IGBT at the second surface are arranged opposite to one another along a vertical direction. In the active area, an IGBT load current may enter or exit the semiconductor body of the IGBT, e.g. via contact plugs on the first surface of the semiconductor body.

A first load electrode of the IGBT may be an emitter electrode. The emitter electrode may be part of a wiring area over the semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) or contact line(s) may be formed in openings in the interlayer dielectric structure to electrically connect parts, e.g. metal lines or contact areas, of different wiring levels to one another. The emitter electrode may be formed by one or more elements of the wiring area. Likewise, the collector electrode may be formed by one or more elements of a wiring area over the second surface.

By adjusting the thickness d1 for an improved on-state resistance in the first part of the active IGBT area and the thickness d2 for an improved turn off softness in the second part of the active IGBT area, both characteristics may be improved with respect to different parts of the active IGBT area. This allows for more flexibility when adjusting characteristic device parameters, and thus, allows for an improvement of the trade-off between area-specific on-state resistance, $R_{on}xA$ and the switching efficiency.

For example, the semiconductor body may comprise a drift region of a first conductivity type, a field stop region of the first conductivity type, and a collector region of a second conductivity type. The contact includes a plurality of protrusions filling grooves in the semiconductor body at the second surface. The grooves are arranged in the second part of the active IGBT area. For example, the contact may completely cover the second surface in the active IGBT area. The contact may also be the only wiring level of the wiring area over the second surface, for example. A density and dimensions, e.g. width and depth, of the grooves, or a density and dimensions, e.g. width and height, of the protrusions may vary with respect to the second surface in the active IGBT area.

The blocking voltage of the IGBT may be adjusted by an impurity concentration and/or a vertical extension of the drift region in the semiconductor body. A doping concentration of the drift region may gradually or in steps increase or decrease with increasing distance to the first surface at least in portions of its vertical extension. According to other examples, the impurity concentration in the drift region may be approximately uniform. For power IGBTs based on silicon, a mean impurity concentration in the drift region may be between $2\times10^{12}$ cm$^{-3}$ and $1\times10^{16}$ cm$^{-3}$, for example in a range from $5\times10^{12}$ cm$^{-3}$ to $1\times10^{15}$ cm$^{-3}$ or to $2\times10^{14}$ cm$^{-3}$. In some cases, the mean impurity concentration in the drift region for IGBTs based on silicon may be in a range from 1×10$^{14}$ cm$^{-3}$ to 1×10$^{16}$ cm$^{-3}$. In the case of a power IGBT based on SiC, a mean impurity concentration in the drift region may be between 5×10$^{14}$ cm$^{-3}$ and 1×10$^{17}$ cm$^{-3}$, for example in a range from 1×10$^{15}$ cm$^{-3}$ to 2×10$^{16}$ cm$^{-3}$. A vertical extension of the drift region may depend on voltage blocking requirements, e.g. a specified voltage class, of the vertical power IGBT. When operating the vertical power IGBT in voltage blocking mode, a space charge region may vertically extend partly or totally through the drift region depending on the blocking voltage applied to the vertical power IGBT. When operating the vertical power IGBT at or close to the specified maximum blocking voltage, the space charge region may reach or penetrate into the field stop region that is configured to prevent the space charge region from further reaching to a collector contact at the second main surface of the semiconductor body. For IGBTs, in this manner, the drift region may be formed using desired low doping levels and with a desired thickness while achieving soft switching.

For example, the IGBT may further comprise third mesa regions. Each of the third mesa regions may be laterally confined by opposite ones of the grooves. The field stop region may comprise a first layer lining sidewalls and a top side of the third mesa regions. The field stop layer may further comprise a second layer on the first layer. A doping concentration of the first layer may be higher than a doping concentration of the second layer. An interface between the drift region and the second layer of the field stop region may be planar, for example. For example, the interface may be located closer to the first surface than a bottom side of the grooves, for example. The second layer may have protruding portions toward the second surface. The protruding portions may be arranged in the mesa regions, for example. The field stop region may further comprise additional layers for realizing a multi-peak field stop region, for example. In some other examples, the second layer may be completely arranged in the third mesa regions. The design flexibility of the field stop region may be adjusted to the specific needs of electric field reduction required by the application areas of the IGBT, for example.

For example, the IGBT may further comprise a plurality of first mesa regions at the first surface of the active IGBT area of the semiconductor body. A width of one of the plurality of first mesa regions along a first lateral direction may be smaller than 20% of a lateral extent of the first part of the active IGBT area that is laterally confined by portions of the second part of the active IGBT area.

For example, a minimum vertical distance between a bottom side of the drift region in the first part of the active IGBT area and the reference level at the first surface may be larger than a minimum vertical distance between a bottom side of the drift region in the second part of the active IGBT area and the reference level at the first surface. This allows for varying a thickness of the drift region within the active IGBT area.

For example, the IGBT may be a reverse conducting IGBT, RC IGBT, that further comprises an active diode area. Similar to the active area of the IGBT, also the active diode may be at least partly surrounded by the edge termination area. Thus, an active area that is partly surrounded by the edge termination area may include both the active area of the IGBT and the active diode area.

For example, the minimum vertical distance between the contact in the first part of the active IGBT area and the reference level at the first surface may be larger than a minimum vertical distance between the contact in the active diode area and the reference level at the first surface. This may allow for an improvement of the forward voltage, VF, versus IGBT overall turn on efficiency (trade-off between ONstate and switching, e.g. turn on of IGBT accompanied by turn off of diode, in RC IGBTs), for example.

For example, the minimum vertical distance between the contact in the second part of the active IGBT area and the reference level at the first surface may be equal to the minimum vertical distance between the contact in the active diode area and the reference level at the first surface. This may allow for simplifying a manufacturing method by joint processing of the active IGBT area and the active diode area, for example.

For example, a minimum vertical distance between the contact in a first part of the active diode area and the reference level at the first surface may be larger than a minimum vertical distance between the contact in a second part of the active diode area and the reference level at the first surface. Similar to the active IGBT area, also a trade-off between characteristic parameters of the diode area of the RC IGBT may be improved by varying parameter optimization across different parts of the active diode area, for example.

For example, the contact may include a plurality of protrusions filling grooves in the semiconductor body at the second surface. The grooves may be arranged in the active diode area. This allows for varying an effective thickness of substrate or drift region in the active diode area. A density and dimensions, e.g. width and depth, of the grooves, or a density and dimensions, e.g. width and height, of the protrusions may vary with respect to the second surface in the active diode area.

For example, the contact in the first part of the active IGBT area may include a first contact material that differs from a second contact material included in the contact in the active diode area. This allows for setting electric contact properties in the diode area and the IGBT area independent from one another.

For example, the first contact material may comprise aluminum, Al, directly adjoining a p-doped collector region in the active IGBT area. For example, the first contact material may include Al, Al doped with Si, or AlSiCu. The second contact material may comprise titanium, Ti, directly adjoining an n-doped cathode region in the active diode area. For example, an Al-based wiring layer may be used for providing an electric contact, e.g. a good ohmic contact, to p-doped semiconductor material, e.g. silicon. For example, a wiring layer formed by Titanium, or Titanium/Tungsten, or Titanium/Nitride-based may be used for providing an electric contact, e.g. a good ohmic contact, to n-doped semiconductor material, e.g. silicon.

For example, the IGBT may further comprise a plurality of first mesa regions in the active IGBT area of the semiconductor body. The IGBT may further comprise a plurality of second mesa regions in the active diode area of the semiconductor body. A first width of one of the plurality of first mesa regions may be smaller than a second width of one of the plurality of second mesa regions. The width may be measured along the first lateral direction. The first lateral direction may be perpendicular to a second lateral direction. The second lateral direction may be a longitudinal direction of strip-shaped transistor cells, for example.

For example, a first number of electric contacts on one of the plurality of second mesa regions along the first lateral direction may be larger than a second number of electric contacts on one of the plurality of first mesa regions along the first lateral direction. For example, along the first lateral direction, one contact may be arranged on one of the first mesa regions, and more than one, e.g. two, three, four, five, or even more than five contacts may be arranged on one of the second mesa regions.

For example, the IGBT may further comprise a plurality of first mesa regions in the active IGBT area of the semiconductor body, and a plurality of second mesa regions in the active diode area of the semiconductor body. The IGBT may further comprise a drift region of a first conductivity type. A first vertical concentration profile of dopants of the first conductivity type at a center of one of the first mesa regions may exceed a vertical concentration profile of dopants of the first conductivity type at a center of one of the second mesa regions over at least 30% of a first height of the plurality of first mesa regions.

For example, a ratio between Δ and Vbr may range from 3 μm/kV to 15 μm/kV, Δ being a difference between the first minimum vertical distance d1 and the second minimum vertical distance d2, and Vbr being a collector to emitter breakdown voltage of the IGBT.

For example, an interface between the contact in the second part of the active diode area and the semiconductor body is substantially flat. For example, substantially flat also covers process/manufacturing variations or characteristics or surface roughness. For example, a bottom side of a trench manufactured by an etch process may be considered substantially flat.

For example, the contact in the second part of the active diode area may include a plurality of protrusions filling grooves in the semiconductor body at the second surface.

Details with respect to structure, or function, or technical benefit of features described above with respect to an IGBT likewise apply to the exemplary methods described herein. Processing the semiconductor body may comprise one or more optional additional features corresponding to one or more aspects mentioned in connection with the proposed concept or one or more examples described above or below.

Another example relates to a method for manufacturing an insulated gate bipolar transistor. The method may comprise forming, in a semiconductor body having a first surface and a second surface, an active area and an edge termination area that at least partly surrounds the active area. The active area may include a first part of an active IGBT area and a second part of the active IGBT area. The method may further comprise forming a contact on the second surface of the semiconductor body. A minimum vertical distance between the contact in the first part of the active IGBT area and a reference level at the first surface may be larger than a minimum vertical distance between the contact in the second part of the active IGBT area and the reference level at the first surface.

For example, forming the active area and the edge termination area may comprise forming a gate structure, an emitter region of a first conductivity type, a body region of a second conductivity type, and a wiring area by processing the semiconductor body at the first surface. Thereafter, forming the active area and the edge termination area may further comprise forming grooves in the semiconductor body at the second surface by at least one masked etch process. Forming the active area and the edge termination area may further comprise introducing dopants into the semiconductor body by at least one ion implantation process through the second surface. Thereafter, forming the active area and the edge termination area may further comprise forming the contact on the second surface. Forming the active area and the edge termination area may further comprise one or more optional additional features, e.g. activation of implanted dopants by thermal annealing, e.g. by rapid thermal processing/annealing (RTP/RTA) or by laser annealing.

For example, at least one ion implantation process through the second surface may be carried out before forming the grooves. At least one ion implantation process through the second surface may be carried out after forming the grooves. This may allow for more flexibility for setting doping concentration profiles, for example.

For example, all ion implantation processes through the second surface may be carried out after forming the grooves. Thus, no ion implantation process through the second surface may be carried out before forming the grooves.

For example, forming the contact may comprise forming a first contact material on the second surface. Forming the contact may further comprise removing the first contact material in the active IGBT area. Thereafter, forming the contact may further comprise forming a second contact material on the second surface. This may allow for adjusting contact materials on the second surface of the semiconductor body with respect to electric contact properties, e.g. ohmic contact properties.

The IGBT may be formed as a reverse conducting IGBT, RC-IGBT by forming an active diode area. The minimum vertical distance between the contact in the first part of the active IGBT area and the reference level at the first surface may be set larger than a minimum vertical distance between the contact in the active diode area and the reference level at the first surface.

The examples and features described above and below may be combined.

Functional and structural details described with respect to the examples above shall likewise apply to the exemplary examples illustrated in the figures and described further below.

In the following, further examples of field effect transistors, FETs, are explained in connection with the accompanying drawings. Functional and structural details described with respect to the examples above shall likewise apply to the exemplary embodiments illustrated in the figures and described further below. In some of the illustrated examples, the first conductivity is n-type and the second conductivity type is p-type for an n-channel IGBT. However, the first conductivity type may also be p-type and the second conductivity type may be n-type for a p-channel IGBT.

FIG. 1A schematically and exemplarily illustrates a cross-sectional view of a part of an IGBT 100. The IGBT 100 includes a semiconductor body 102 having a first surface 106 and a second surface 112. The IGBT 100 includes an active area 104 and an edge termination area 108 that at least partly surrounds the active area 104. Although not illustrated in the simplified view of FIG. 1A, the active area 104 may be an area where an emitter region of the IGBT 100 at the first surface 106 and a collector region of the IGBT 100 at the second surface 112 are arranged opposite to one another along a vertical direction y. In other words, in the active area 104, an IGBT load current may enter or exit the semiconductor body 102 of the IGBT 100. In the edge termination area 108, a blocking voltage between the active area and a field-free region may laterally drop across a termination structure (not illustrated in FIG. 1A).

Figure 1B:
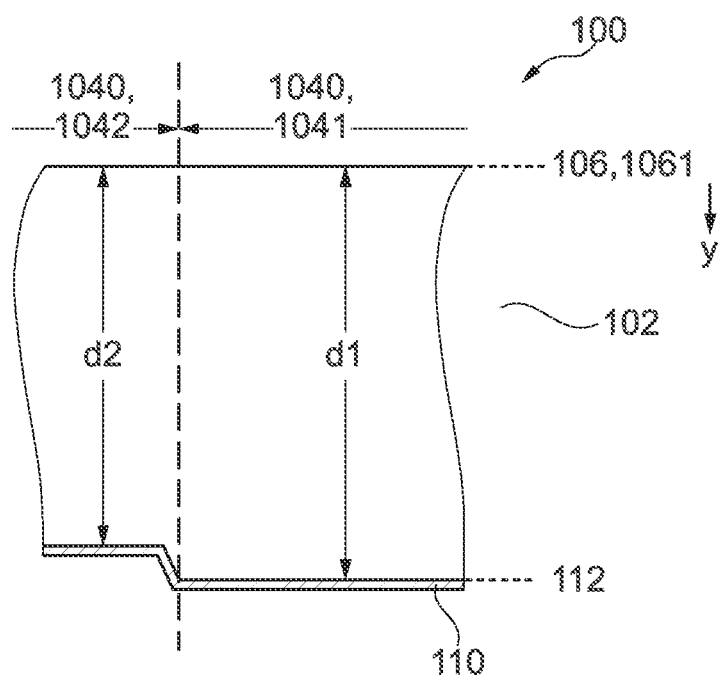

The schematic cross-sectional view of FIG. 1B is a more detailed view of the active area 104 of the IGB 100 illustrated in FIG. 1A. The active area 104 includes a first part 1041 of an active IGBT area 1040 and a second part 1042 of the active IGBT area 1040. A contact 110 is arranged on the second surface 112 of the semiconductor body 102. A minimum vertical distance d1 between the contact 110 in the first part 1041 of the active IGBT area 1040 and a reference level 1061 at the first surface 106 is larger than a minimum vertical distance d2 between the contact 110 in the second part 1042 of the active IGBT area 1040 and the reference level 1061 at the first surface 106. By adjusting the thickness d1 for an improved on-state resistance and the thickness d2 for an improved switching softness, both characteristics may be improved with respect to different parts of the active IGBT area 1040. This may allow for more flexibility when adjusting characteristic device parameters, and thus, may allow for an improvement of the trade-off between area-specific on-state resistance, $R_{on}xA$ and the switching efficiency, for example.

Figure 2:
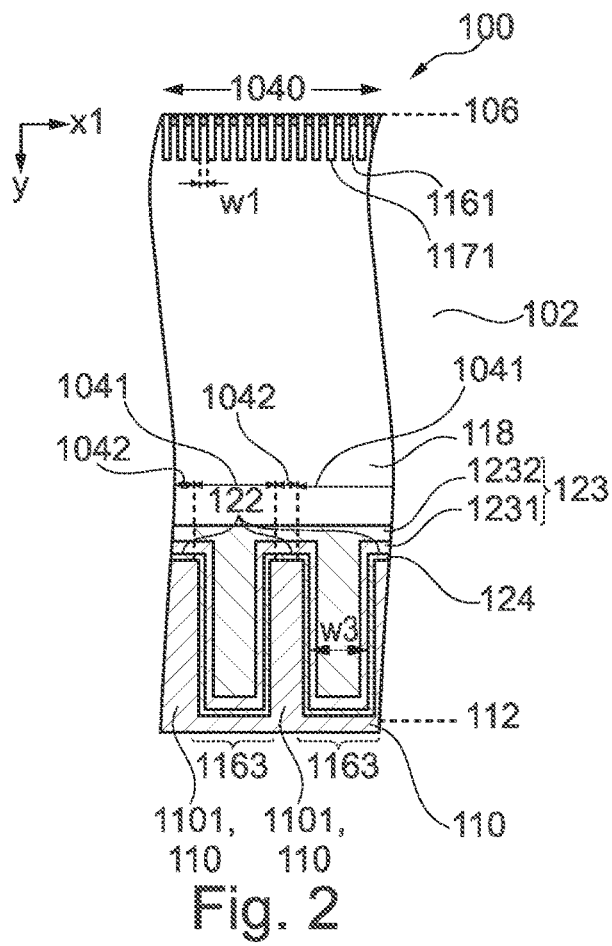
FIGS. 2 to 7 are partial cross-sectional views for illustrating design examples of a collector contact and field stop region of an IGBT.

FIG. 2 schematically and exemplarily shows an IGBT 100 that is based on the example of FIGS. 1A, 1B.

The IGBT 100 includes a plurality of first mesa regions 1161 in the active IGBT area 1040 at the first surface 106 of the semiconductor body 102. Each of the first mesa regions 1161 is laterally confined, e.g. along a first lateral direction x1, by trench structures 1171. In the trench structures 1171, a gate and/or field dielectric as well as a gate and/or field electrode may be arranged, for example.

In the semiconductor body 102, a drift region 118 of a first conductivity type is arranged. A field stop region 123 of the first conductivity type, and a collector region 124 of a second conductivity type are arranged between the drift region 118 and the second surface 112. The contact 110, e.g. a collector contact, includes a plurality of protrusions 1101 filling grooves 122 in the semiconductor body 102 at the second surface 112. A pair of the grooves 122 laterally confines, along the first lateral direction x1, a third mesa region 1163. The field stop region 123 includes a first layer 1231 lining sidewalls and a top side of the mesa regions 1163, and a second layer 1232 on the first layer 1231. A doping concentration of the first layer 1231 is higher than a doping concentration of the second layer 1232. The second layer 1232 is limited toward the second surface 112 by the first layer 1231, and may be limited toward the first surface 106 by the drift region 118, e.g. by a planar interface to the drift region 118. A width w3 of the third mesa regions 1163 is larger than a width w1 of the first mesa regions 1161 at the first surface 1161.

Sidewalls of the third mesa regions 1163 may also be tapered for ease of processing, e.g. ease of depositing material(s) for the contact 110 or for ease of ion implantation processes for manufacturing the field stop region 123 or the collector region 124.

Figure 3:
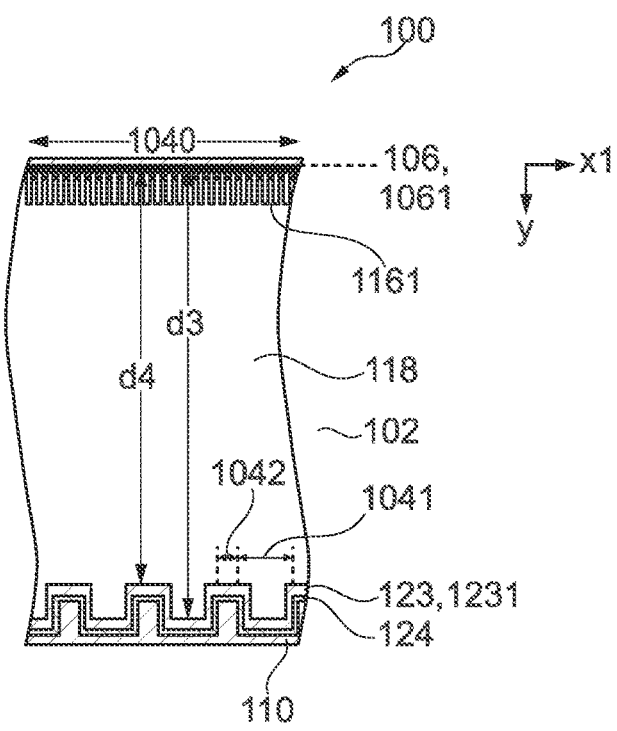

FIG. 3 schematically and exemplarily shows an IGBT 100 that is based on the example of FIGS. 1A, 1B. The IGBT 100 shown in FIG. 3 differs from the IGBT 100 illustrated in FIG. 2 in that a minimum vertical distance d3 between a bottom side of the drift region 118 in the first part 1041 of the active IGBT area 1040 and the reference level 1061 at the first surface 106 is larger than a minimum vertical distance d4 between a bottom side of the drift region 118 in the second part 1042 of the active IGBT area 1040 and the reference level 1061 at the first surface 106. Other than in the example illustrated in FIG. 2, a thickness variation of the drift region 118 may be achieved by omitting the second layer 1232 of the field stop region 123 of FIG. 2, for example. Sidewalls of the third mesa regions 1163 may also be tapered for ease of processing, e.g. ease of depositing material(s) for the contact 110 or for ease of ion implantation processes for manufacturing the field stop region 123 or the collector region 124.

Figure 4:
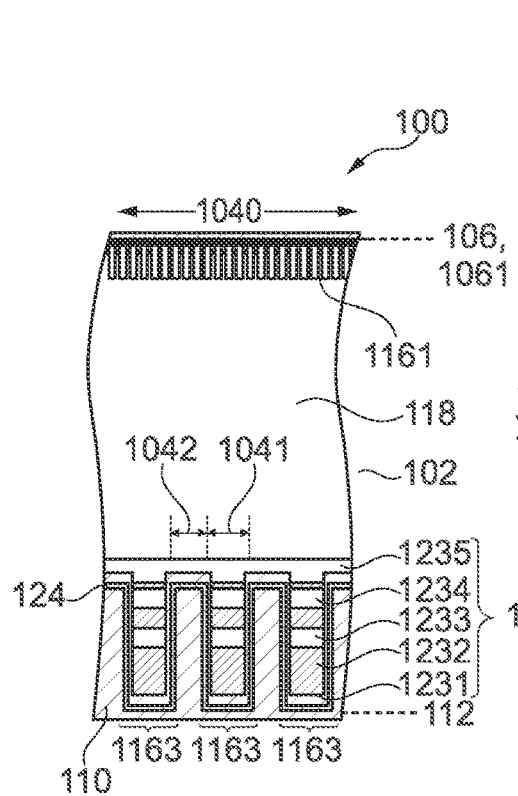

FIG. 4 schematically and exemplarily shows an IGBT 100 that is based on the example of FIGS. 1A, 1B. The IGBT 100 shown in FIG. 4 differs from the IGBT 100 illustrated in FIG. 2 in that the field stop region 123 includes, in addition to the first and second layers 1231, 1232, third, fourth and fifth layers 1233, 1234, 1235. Each of the third, fourth and fifth layers 1233, 1234, 1235 has a larger doping concentration than the second layer 1232. Thus, the field stop region 123 includes a multi-peak doping concentration profile along the vertical direction y. The multiple peaks may be formed, for example, by ion implantation processes having different ion implantation energies, e.g. different proton implantation energies with suitable subsequent annealing steps performed e.g. at temperatures between 350° C. and 420° C. for a time period between 30 minutes and 5 hours. A number of peaks and a vertical doping profile of the field stop region 123 may be varied and adapted to the specific needs.

Figure 5:
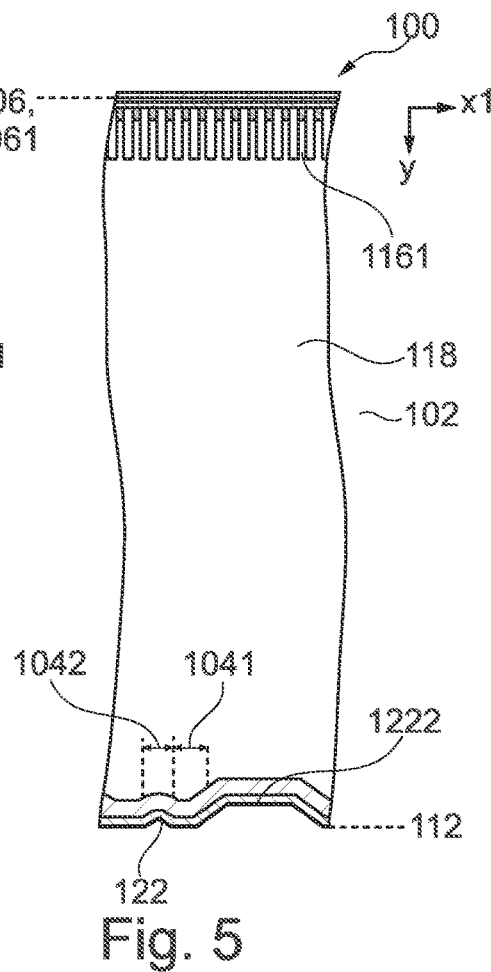

In addition to the grooves 122 defining the second part 1042 of the active IGBT area 1040 in the examples described above, second, third or even more grooves may be provided that differ from one another by at least one of depth or width. Second grooves 1222 having a larger width and a larger depth than the grooves 122 are schematically and exemplarily illustrated for the IGBT 100 of FIG. 5 that is based on the example of FIG. 3. By varying the depth and/or width of the grooves across the active IGBT area 1040, e.g. in any one of the above examples, the trade-off between area-specific on-state resistance, $R_{on}xA$ and the switching efficiency may be variably adjusted with respect to different parts of the active IGBT area 1040. Varying the groove depth may be achieved, for example, by an anisotropic etch with crystal plane selectivity using different widths of etch mask openings, e.g. by wet alkaline etch of silicon with e.g. tetramethylammonium hydroxide(TMAH) with or without surfactants like isopropyl alcohol(IPA) solutions.

In the examples described above, the collector layer 124 may have a constant lateral doping concentration, or may include portions that are doped higher and/or lower than other portions. For example, parts of the collector region 124 at a bottom side of the grooves 122 may be doped higher than parts of the collector region 124 at sidewalls of the grooves 122 and/or parts of the collector region 124 at the second surface 112. Likewise, parts of the collector region 124 at the second surface 112 may be doped higher than parts of the collector region 124 at a bottom side of the grooves 122 or at sidewalls of the grooves 122.

Figure 6:
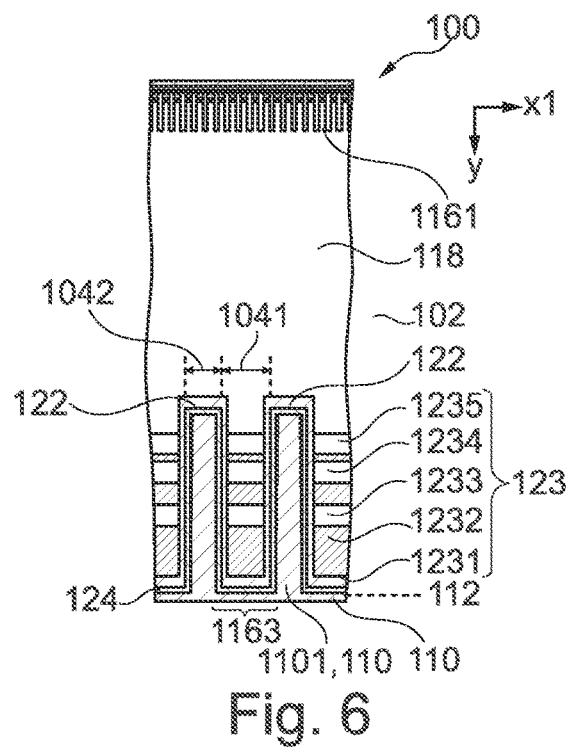
Figure 7:
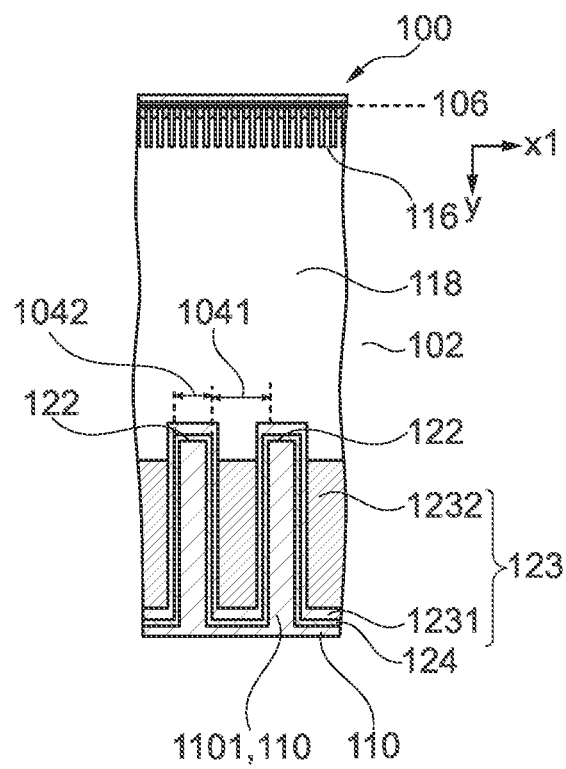

FIGS. 6 and 7 schematically and exemplarily show IGBTs 100 that are based on the examples illustrated in FIGS. 4 and 2, respectively, but differ from the examples illustrated in FIGS. 4 and 2 in that the grooves 122 extend deeper into the semiconductor body 102 from the second surface 112 than the second layer 1232 of the field stop region 123.

Figure 8:
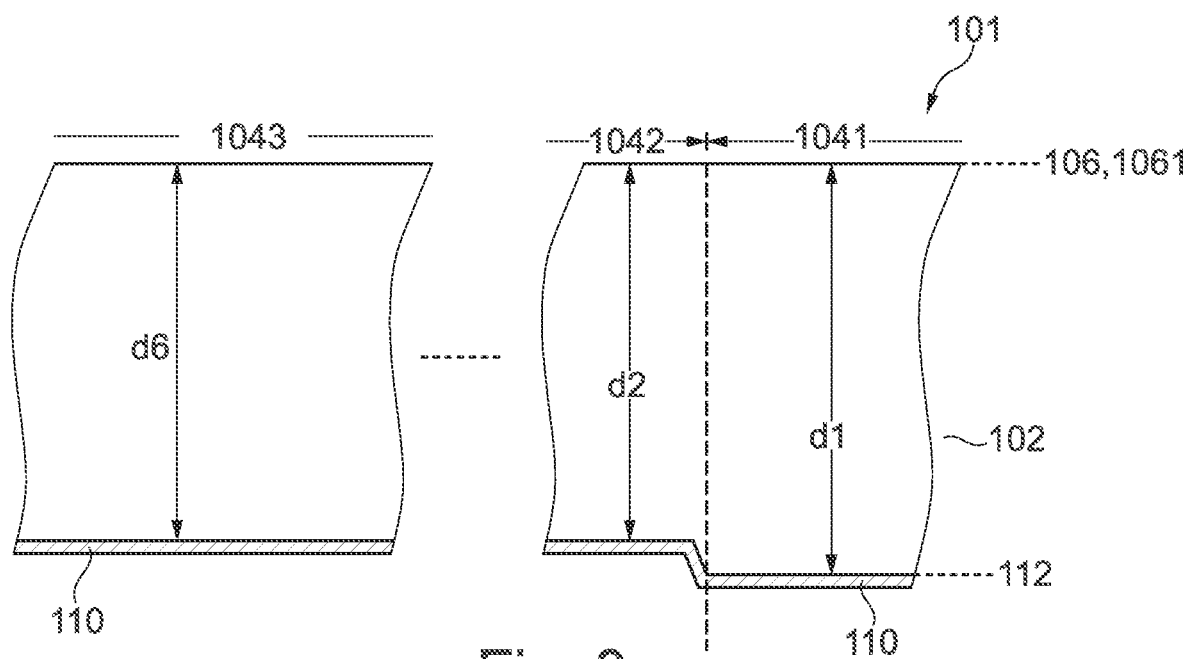
FIGS. 8 and 9 are partial cross-sectional views for illustrating design examples of a reverse conducting IGBT, RC IGBT.

FIG. 8 schematically and exemplarily shows an IGBT that is formed as a reverse conducting IGBT, RC IGBT 101 and further includes an active diode area 1043.

The minimum vertical distance d1 between the contact 110 in the first part 1041 of the active IGBT area 1040 and the reference level 1061 at the first surface 106 is larger than a minimum vertical distance d6 between the contact 110 in the active diode area 1043 and the reference level 1061 at the first surface 106.

In some examples, e.g. the example illustrated in FIG. 8, the minimum vertical distance d2 between the contact 110 in the second part 1042 of the active IGBT area 1040 and the reference level 1061 at the first surface 106 is equal (i.e. equal in the line with variations caused by process fluctuations/production non uniformities) to the minimum vertical distance d6 between the contact 110 in the active diode area 1043 and the reference level 1061 at the first surface 106.

Figure 9:
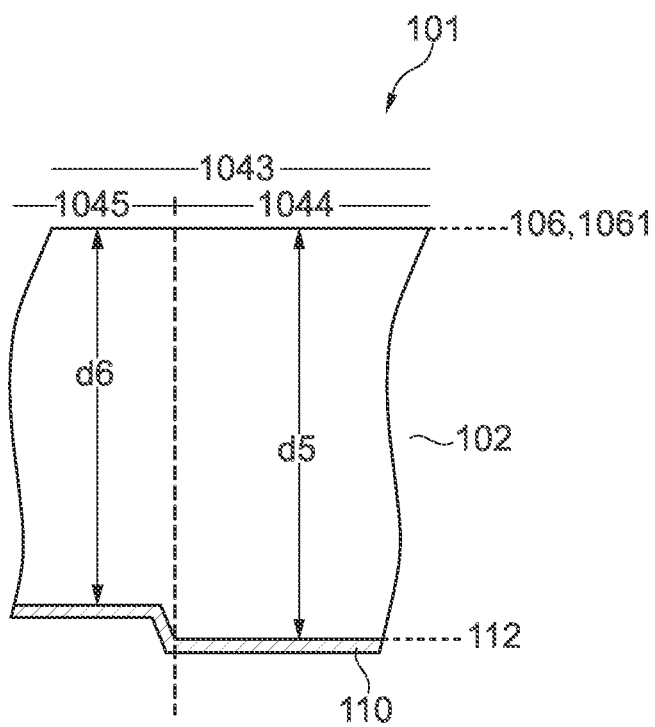

FIG. 9 schematically and exemplarily shows the active diode area 1043 of another example of a RC IGBT 101. The RC IGBT 101 has a minimum vertical distance d5 between the contact 110 in a first part 1044 of the active diode area 1043 and the reference level 1061 at the first surface 106 that is larger than a minimum vertical distance d6 between the contact 110 in a second part 1045 of the active diode area 1043 and the reference level 1061 at the first surface 106.

Figure 10A:
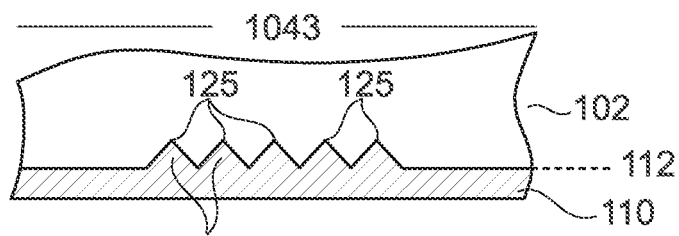
FIGS. 10A and 10B are partial cross-sectional views for illustrating design examples of a cathode contact in an active diode area of the RC IGBT.
Figure 10B:
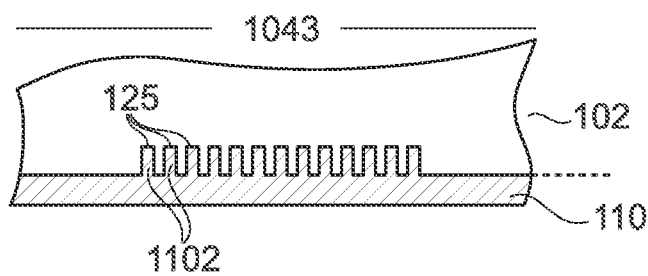

As is schematically illustrated in the schematic cross-sectional view of FIGS. 10A, 10B, the contact 110 in the exemplary active diode areas 1043 includes a plurality of protrusions 1102 filling grooves 125 in the semiconductor body 102 at the second surface 112, and the grooves 125 are arranged in the active diode area 1043. The contact 110 in the first part 1041 of the active IGBT area 1040 (see e.g. FIGS. 1 to 7) may include a first contact material that differs from a second contact material included in the contact 110 in the active diode area 1043, e.g. a cathode contact. For example, the first contact material may comprise aluminum, Al, directly adjoining a p-doped collector region for an n-channel RC IGBT. The second contact material may comprise titanium, Ti, directly adjoining an n-doped cathode region for an n-channel RC IGBT. For example, an Al-based wiring layer may be used for providing an electric contact, e.g. ohmic contact, to p-doped semiconductor material, e.g. silicon. For example, a wiring layer formed by Titanium, or Titanium/Tungsten, or Titanium/Nitride-based may be used for providing an electric contact, e.g. ohmic contact, to n-doped semiconductor material, e.g. silicon. Forming the contact 110 by first and second contact materials may be carried out, for example, by forming the first contact material on the second surface 112, removing the first contact material in the active IGBT area 1041, 1042, and thereafter forming a second contact material on the second surface 112.

Referring to the schematic and exemplary cross-sectional views of FIGS. 11A, 11B illustrating an RC IGBT 101, the RC IGBT 101 includes a plurality of first mesa regions 1161 in the active IGBT area 1040 of the semiconductor body 102, and a plurality of second mesa regions 1162 in the active diode area 1043 of the semiconductor body 102. A first width w1 of one of the plurality of first mesa regions 1161 is smaller than a second width w2 of one of the plurality of second mesa regions 1162. A first number of electric contacts 1311 on and/or extending into one of the plurality of second mesa regions 1162 along the first lateral direction x1 is larger than a second number of electric contacts 1312 on one of the plurality of first mesa regions 1161 along the first lateral direction x1.

The schematic graph of FIG. 12 is an exemplary illustration of vertical concentration profiles c of dopants of the first conductivity type. For example, a first vertical concentration profile of dopants c1 of the first conductivity type at a center of one of the first mesa regions 1161 (see FIG. 11B) exceeds a vertical concentration profile of dopants of the first conductivity type at a center of one of the second mesa regions 1162 (see FIG. 11A) over at least 30% of a first height h1 of the plurality of first mesa regions 1161.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An insulated gate bipolar transistor (IGBT), comprising:
a semiconductor body having a first surface and a second surface, and including an active area and an edge termination area that at least partly surrounds the active area, wherein the active area includes a first part of an active IGBT area and a second part of the active IGBT area; and
a contact on the second surface of the semiconductor body, wherein a minimum vertical distance between the contact in the first part of the active IGBT area and a reference level at the first surface is larger than a minimum vertical distance between the contact in the second part of the active IGBT area and the reference level at the first surface.

2. The IGBT of claim 1, wherein the semiconductor body comprises a drift region of a first conductivity type, a field stop region of the first conductivity type, and a collector region of a second conductivity type, wherein the contact includes a plurality of protrusions filling grooves in the semiconductor body at the second surface, and wherein the grooves are arranged in the second part of the active IGBT area.

3. The IGBT of claim 2, further comprising mesa regions, each of the mesa regions being laterally confined by opposite ones of the grooves, wherein the field stop region comprises a first layer lining sidewalls and a top side of the mesa regions, and a second layer on the first layer, and wherein a doping concentration of the first layer is higher than a doping concentration of the second layer.

4. The IGBT of claim 2, further comprising a plurality of mesa regions at the first surface of the active IGBT area of the semiconductor body, wherein a first width of one of the plurality of mesa regions along a first lateral direction is smaller than 20% of a lateral extent of the first part of the active IGBT area that is laterally confined by portions of the second part of the active IGBT area.

5. The IGBT of claim 2, wherein a minimum vertical distance between a bottom side of the drift region in the first part of the active IGBT area and the reference level at the first surface is larger than a minimum vertical distance between a bottom side of the drift region in the second part of the active IGBT area and the reference level at the first surface.

6. The IGBT of claim 1, wherein the IGBT is a reverse conducting IGBT (RC-IGBT) and further comprises an active diode area.

7. The IGBT of claim 6, wherein the minimum vertical distance between the contact in the first part of the active IGBT area and the reference level at the first surface is larger than a minimum vertical distance between the contact in the active diode area and the reference level at the first surface.

8. The IGBT of claim 7, wherein the minimum vertical distance between the contact in the second part of the active IGBT area and the reference level at the first surface is equal to the minimum vertical distance between the contact in the active diode area and the reference level at the first surface.

9. The IGBT of claim 6, wherein a minimum vertical distance between the contact in a first part of the active diode area and the reference level at the first surface is larger than a minimum vertical distance between the contact in a second part of the active diode area and the reference level at the first surface.

10. The IGBT of claim 6, wherein the contact includes a plurality of protrusions filling grooves in the semiconductor body at the second surface, and wherein the grooves are arranged in the active diode area.

11. The IGBT of claim 6, wherein the contact in the first part of the active IGBT area includes a first contact material that differs from a second contact material included in the contact in the active diode area.

12. The IGBT of claim 11, wherein the first contact material comprises aluminum directly adjoining a p-doped collector region, and wherein the second contact material comprises titanium directly adjoining an n-doped cathode region.

13. The IGBT of claim 6, further comprising a plurality of first mesa regions in the active IGBT area of the semiconductor body, and a plurality of second mesa regions in the active diode area of the semiconductor body, wherein a first width of one of the plurality of first mesa regions is smaller than a second width of one of the plurality of second mesa regions.

14. The IGBT of claim 13, wherein a first number of electric contacts on one of the plurality of second mesa regions along the first lateral direction is larger than a second number of electric contacts on one of the plurality of first mesa regions along the first lateral direction.

15. The IGBT of claim 6, further comprising a plurality of first mesa regions in the active IGBT area of the semiconductor body, a plurality of second mesa regions in the active diode area of the semiconductor body, and a drift region of a first conductivity type, wherein a first vertical concentration profile of dopants of the first conductivity type at a center of one of the first mesa regions exceeds a vertical concentration profile of dopants of the first conductivity type at a center of one of the second mesa regions over at least 30% of a first height of the plurality of first mesa regions.

16. A method for manufacturing an insulated gate bipolar transistor (IGBT), the method comprising:
    forming, in a semiconductor body having a first surface and a second surface, an active area and an edge termination area that at least partly surrounds the active area, wherein the active area includes a first part of an active IGBT area and a second part of the active IGBT area;
    forming a contact on the second surface of the semiconductor body, wherein a minimum vertical distance between the contact in the first part of the active IGBT area and a reference level at the first surface is larger than a minimum vertical distance between the contact in the second part of the active IGBT area and the reference level at the first surface.

17. The method of claim 16, wherein forming the active area and the edge termination area comprises:
    forming a gate structure, an emitter region of a first conductivity type, a body region of a second conductivity type, and a wiring area by processing the semiconductor body at the first surface;
    after forming the gate structure, the emitter region, the body region, and the wiring area, forming grooves in the semiconductor body at the second surface by at least one masked etch process;
    introducing dopants into the semiconductor body by at least one ion implantation process through the second surface; and
    after introducing the dopants into the semiconductor body, forming the contact on the second surface.

18. The method of claim 17, wherein at least one ion implantation process through the second surface is carried out before forming the grooves, and wherein at least one ion implantation process through the second surface is carried out after forming the grooves.

19. The method of claim 18, wherein all ion implantation processes through the second surface are carried out after forming the grooves.

20. The method of claim 16, wherein forming the contact comprises:
    forming a first contact material on the second surface;
    removing the first contact material in the active IGBT area; and
    after removing the first contact material in the active IGBT area, forming a second contact material on the second surface.

21. The method of claim 16, wherein the IGBT is formed as a reverse conducting IGBT (RC-IGBT) by forming an active diode area.

22. The method of claim 21, wherein the minimum vertical distance between the contact in the first part of the active IGBT area and the reference level at the first surface is set larger than a minimum vertical distance between the contact in the active diode area and the reference level at the first surface.

* * * * *